United States Patent
Derner et al.

(10) Patent No.: US 10,916,548 B1
(45) Date of Patent: Feb. 9, 2021

(54) MEMORY ARRAYS WITH VERTICAL ACCESS TRANSISTORS

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/522,336

(22) Filed: Jul. 25, 2019

(51) Int. Cl.

| H01L 27/108 | (2006.01) |
|---|---|
| G11C 11/404 | (2006.01) |
| G11C 11/4097 | (2006.01) |
| H01L 29/786 | (2006.01) |
| H01L 27/02 | (2006.01) |
| H01L 23/528 | (2006.01) |
| G11C 11/4091 | (2006.01) |

(52) U.S. Cl.
CPC ...... *H01L 27/10814* (2013.01); *G11C 11/404* (2013.01); *G11C 11/4091* (2013.01); *G11C 11/4097* (2013.01); *H01L 23/5286* (2013.01); *H01L 27/0207* (2013.01); *H01L 27/10811* (2013.01); *H01L 27/10841* (2013.01); *H01L 27/10864* (2013.01); *H01L 27/10897* (2013.01); *H01L 29/78642* (2013.01)

(58) Field of Classification Search
CPC ............... G11C 11/404; G11C 11/4097; H01L 27/10808; H01L 27/10841; H01L 27/10864; H01L 27/10814; H01L 27/10811
See application file for complete search history.

(56) References Cited

U.S. PATENT DOCUMENTS

| 6,303,425 | B1* | 10/2001 | Maeda | H01L 21/84 438/239 |
| 6,456,521 | B1 | 9/2002 | Hsu et al. | |
| 7,701,794 | B2* | 4/2010 | Kajigaya | G11C 11/4097 365/205 |
| 9,472,252 | B2 | 10/2016 | Hofstetter et al. | |
| 2009/0175066 | A1* | 7/2009 | Kim | G11C 11/22 365/149 |
| 2020/0066327 | A1* | 2/2020 | Derner | G11C 11/4097 |

* cited by examiner

*Primary Examiner* — Son L Mai
(74) *Attorney, Agent, or Firm* — Brooks, Cameron & Huebsch, PLLC

(57) ABSTRACT

An apparatus can have first and second memory cells. The first memory cell can have a first storage device selectively coupled to a first digit line at a first level by a first vertical transistor at a second level. The second memory cell can have a second storage device selectively coupled to a second digit line at the first level by a second vertical transistor at the second level. A third digit line can be at a third level and can be coupled to a main sense amplifier. A local sense amplifier can be coupled to the first digit line, the second digit line, and the third digit line. The second level can be between the first and third levels.

26 Claims, 8 Drawing Sheets

US 10,916,548 B1

MEMORY ARRAYS WITH VERTICAL ACCESS TRANSISTORS

TECHNICAL FIELD

The present disclosure relates generally to memory devices, and more particularly, to memory arrays with vertical access transistors.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random access memory (DRAM), static random access memory (SRAM), and synchronous dynamic random access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric-random-access memory (FeRAM), or the like.

In some examples, DRAM memory arrays can include respective groups of DRAM memory cells coupled to respective digit lines. A respective memory cell from each group can be commonly coupled to a respective access line, such as a word line. In some examples, a DRAM memory cell can include a storage device (e.g., storage element), such as a capacitor, coupled by an access device, such as an access transistor, to a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1:
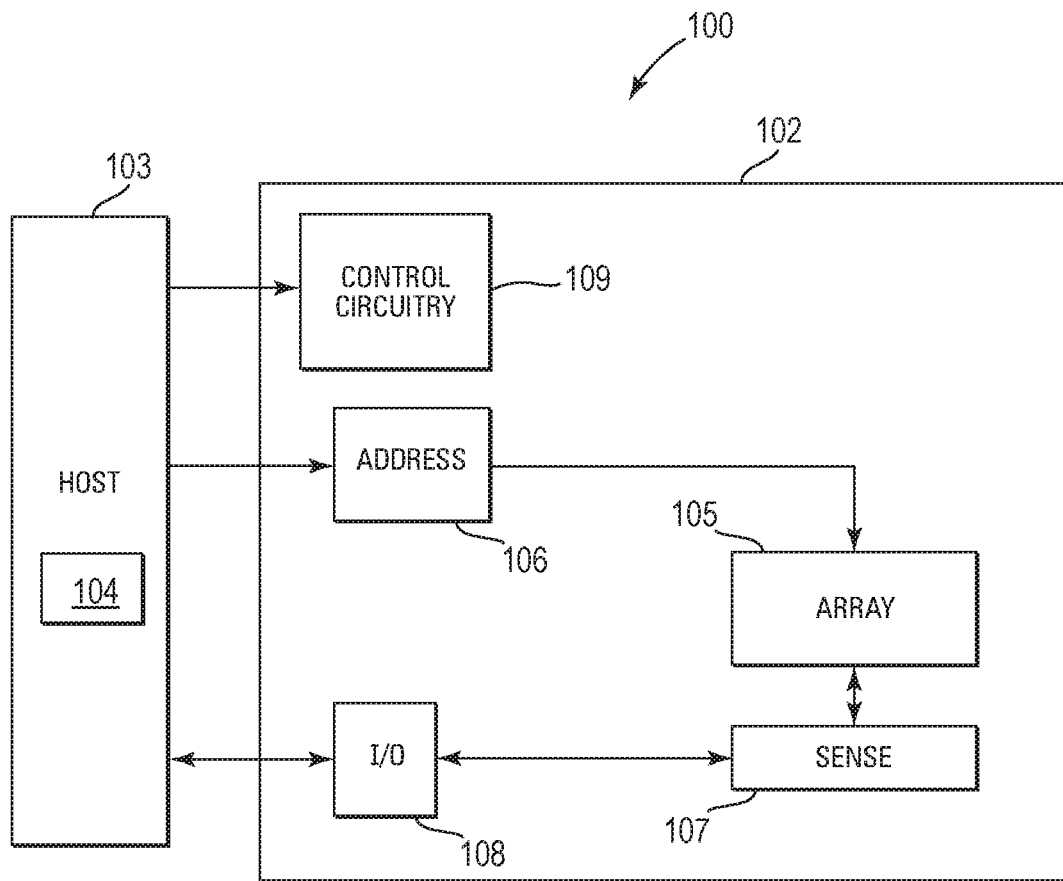
FIG. 1 is a block diagram of an apparatus in accordance a number of embodiments of the present disclosure.

An apparatus, such as a memory array, can have first and second memory cells. The first memory cell can have a first storage device selectively coupled to a first local digit line at a first level by a first vertical thin-film transistor (TFT) at a second level. The second memory cell can have a second storage device selectively coupled to a second local digit line at the first level by a second vertical TFT at the second level. A third digit line (e.g., a hierarchical digit line) can be at a third level and can be coupled to a main sense amplifier. A local sense amplifier, such as a common source local sense amplifier (e.g., a pull-down charge amplifier), can be coupled to the first local digit line, the second local digit line, and the hierarchical digit line. The second level can be between the first and third levels.

The local sense amplifier coupled to the first local digit line, the second local digit line, and the hierarchical digit line can be referred to as a hierarchical scheme. The first and second local digit lines at the first level and the hierarchical digit line at the second level can be referred to as a hierarchical digit line structure, for example. Hierarchical schemes can be applied to achieve high-speed operation, for example. The local sense amplifier can amplify the signal in the hierarchical digit line that can weaken with distance along the hierarchical digit line and can allow for a longer hierarchical digit line, and thus more local digit lines and more memory cells.

The first and second vertical TFTs can be referred to as vertical access TFTs because they can provide access to (e.g., select) the storage devices. Positioning the vertical access TFTs at the level between the local digit lines and the hierarchical digit line can reduce the space requirements compared to previous approaches that may use planar access transistors below the local digit lines to selectively couple the storage devices of memory cells to the local digit lines. For example, planar access transistors can be formed in and/or on a monocrystalline semiconductor, such as monocrystalline silicon (e.g., under the memory array).

In various examples, the space previously occupied by the planar access transistors can be used for logic, such as complementary metal-oxide-semiconductor (CMOS) logic. In some instances, the local sense amplifier can be formed in the space previously occupied by the planar access transistors and can be formed on and/or in the semiconductor, for example, as a CMOS device. In various instances, some CMOS local sense amplifiers can perform better than some local sense amplifiers with vertical TFTs.

Some local sense amplifiers with vertical TFTs can be in a region (e.g., a gap) between the first and second memory cells. However, forming the local sense amplifier in the space previously occupied by the planar access transistors instead of in the gap between the first and second memory cells can reduce the size of the gap, and thus the size of the array. For example, the area (e.g., footprint) of the semiconductor can be reduced.

The memory arrays disclosed herein that use the vertical access TFTs disclosed herein have improved refresh performance compared to memory arrays that use planar access transistors under the memory array. For example, refresh is the process of periodically reading information from memory cells and immediately rewriting the read information back to the same memory cells without modification.

The memory arrays disclosed herein that use the vertical access TFTs disclosed herein can be less susceptible to row hammer than memory arrays that use planar access transistors under the memory array. For example, row hammer refers to undesirable changes in capacitor voltages of the memory cells corresponding to neighboring memory cells being frequently accessed.

FIG. 1 is a block diagram of an apparatus in accordance a number of embodiments of the present disclosure. For example, the apparatus can be an electronic system, such as a computing system 100. Computing system 100 can include a memory device 102 coupled to a host 103. Host 103 can include a processing device 104 that can include a host processor. Host 103 can be, for example, a host system, such as a personal laptop computer, a desktop computer, a digital camera, a mobile device (e.g., cellular phone), network server, Internet of Things (IoT) enabled device, or a memory card reader, among various other types of hosts.

Memory device 102 can be a DRAM device, an FeRAM device, among other types of memory devices. Memory device 102 includes a memory array 105 of memory cells, such as DRAM memory cells, ferroelectric memory cells, among other types of memory cells. For example, memory array 105 can include the memory arrays disclosed herein. Memory device 102 includes address circuitry 106 coupled to array 105 and configured to receive address signals (e.g., addresses) from host 103 for addressing locations in array 105. In various embodiments, memory device 102 and/or memory array 105 can be separately referred to as apparatus.

Sense circuitry 107 can be used to read data from array 105 and couple output data to I/O circuitry 108. The I/O circuitry operates in a bi-directional manner to receive data from host 103 and pass this data to array 105. In some examples, sense circuitry 107 can include the main sense amplifiers discussed herein. Memory device 102 includes control circuitry 109 to manage data storage and retrieval from array 105 in response to instructions generated by host 103. In some examples, control circuitry 109 can include a state machine and/or a sequencer.

Figure 2:
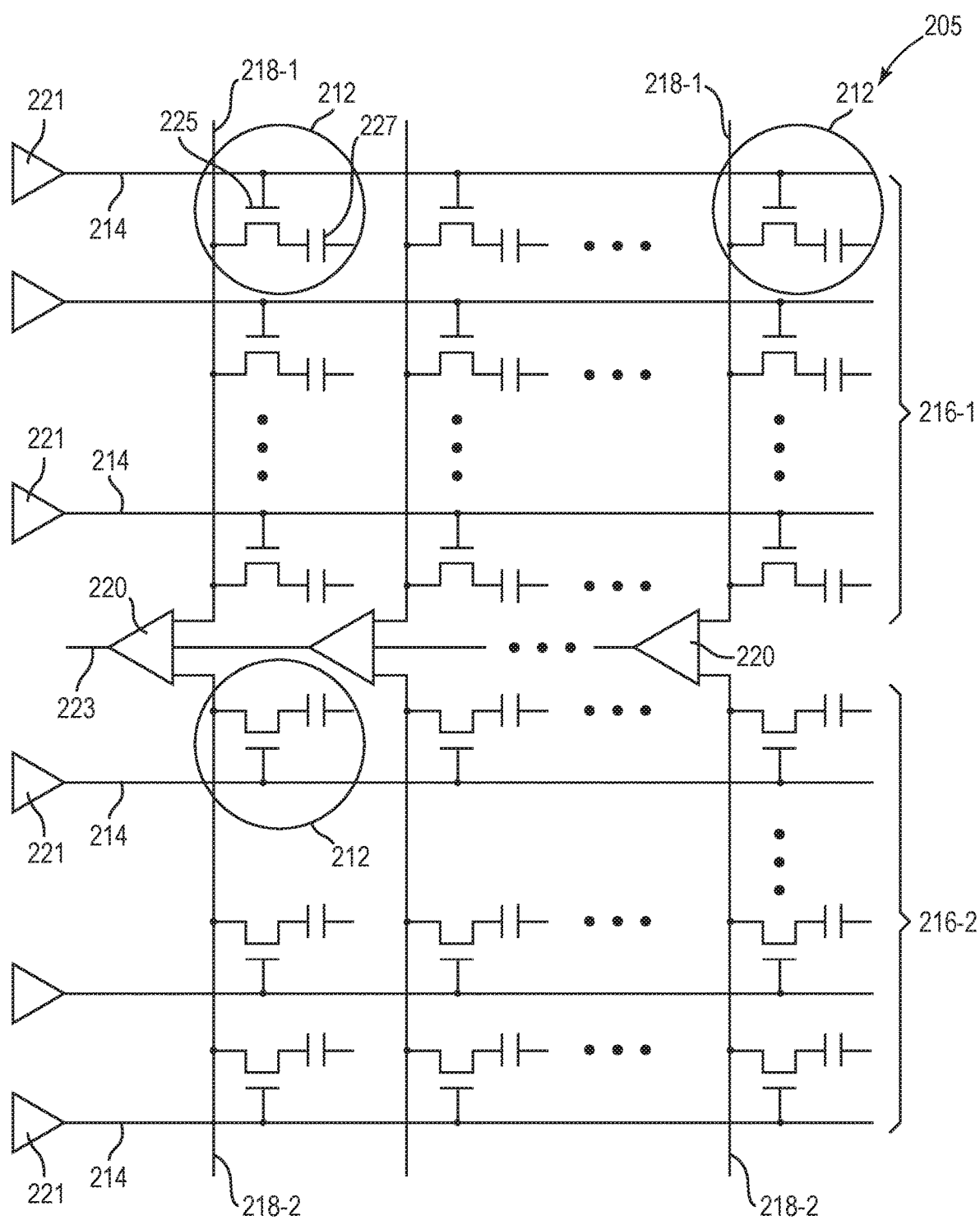
FIG. 2 is a schematic diagram of a memory array in accordance with a number of embodiments of the present disclosure.

FIG. 2 illustrates a schematic diagram of an example memory array 205 in accordance with a number of embodiments of the present disclosure. For example, memory array 205 can be a DRAM array, an FeRAM array, among other arrays. In some examples, memory array 205 can be at least a portion of memory array 105.

Memory array 205 can include memory cells 212 commonly coupled to access lines 214 that can extend in an x-direction in FIG. 2. Respective groups 216-1 of memory cells 212 can be coupled to respective digit lines 218-1, and respective groups 216-2 of memory cells 212 can be coupled to respective digit lines 218-2. Digit lines 218, that can be referred to data lines (e.g., bit lines), can extend in the y-direction in FIG. 2.

A respective local sense amplifier 220, such as a common source local sense amplifier, can be coupled to respective digit lines 218-1 and 218-2. Each respective access line 214 can be coupled to a respective access line driver 221. In some examples, local sense amplifiers 220 can be commonly coupled to a bus 223. In some examples, digit lines 218 can be referred to as local digit lines (e.g., in contrast to hierarchical digit lines).

Each memory cell 212 can include an access device, such as an access transistor 225, and a storage device, such as a capacitor 227. A capacitor 227 can be coupled to a respective digit line 218 through a respective access transistor 225 whose gate can be coupled to a respective access line 214. For example, the respective access transistor 225 can selectively couple the capacitor 227 to the respective digit line 218 in response to the receiving an access signal from the respective access line 214. In some examples, a ferroelectric material can be between the plates of the capacitor.

The access transistors 225 can be vertical transistors, such as vertical TFTs, formed on pitch with the respective digit lines 218 and located above or below the digit lines 218 (e.g., in the z direction). For example, access transistors 225 can be aligned with and be directly vertically above or below the respective digit lines 218. In some examples, a pair of digit lines 218-1 and 218-2 (e.g., complementary digit lines) commonly coupled to a respective sense amplifier 220 can be aligned with and selectively coupled to an additional (e.g., a hierarchical) digit line (not shown in FIG. 2), such as a digit line 350 in FIG. 3, a digit line 650 in FIG. 6, a digit line 750 in FIG. 7, or a digit line 850 in FIG. 8. For example, the pair of digit lines 218-1 and 218-2 can be aligned with and be directly vertically below or above the additional access line. For example, each pair of digit lines 218-1 and 218-2 commonly coupled to a respective sense amplifier 220 can be on pitch with and coupled to respective access lines 218 and can be on pitch with and coupled to a hierarchical digit line.

Figure 3:
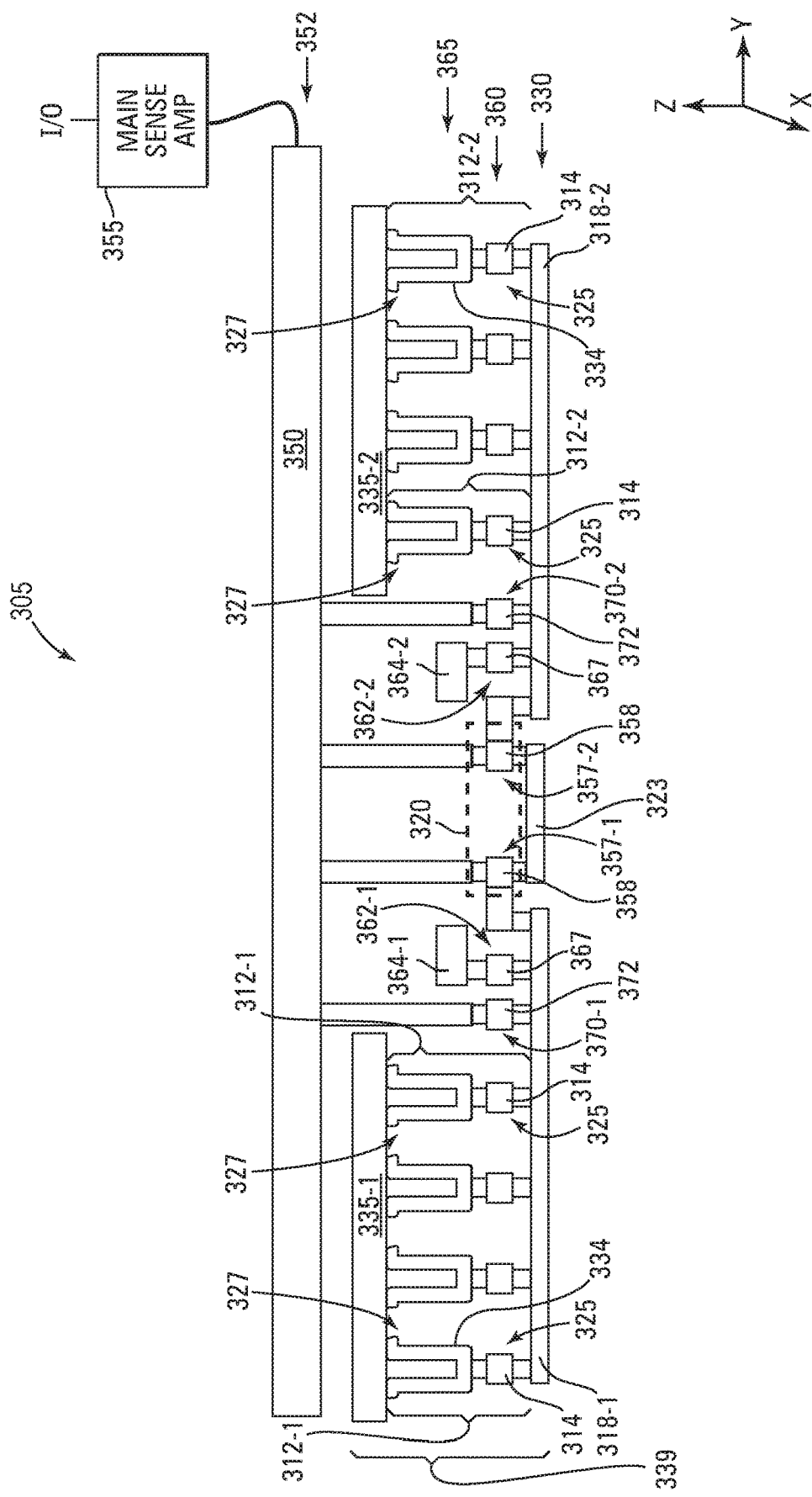
FIG. 3 is a cross-sectional view of a portion of a memory array having vertical access transistors and a local sense amplifier with vertical transistors in accordance with a number of embodiments of the present disclosure.

FIG. 3 is a cross-sectional view of a portion of a memory array, such as a memory array 305, in accordance with a number of embodiments of the present disclosure. For example, memory array 305 can be a portion of memory array 105 and/or memory array 205.

In FIG. 3, the z-direction is perpendicular to the y-direction and the x-direction that is into and out of the page and perpendicular to the face plane of the page (e.g., y-z plane). The z-direction can be perpendicular to a base plane, such as a base structure (e.g., semiconductor), and can be the vertical direction. It should be recognized the term "perpendicular" takes into account variations from "exactly" perpendicular due to routine manufacturing and/or assembly variations and that one of ordinary skill in the art would know what is meant by the term "perpendicular."

Digit lines 318-1 and 318-2 (e.g., local digit lines) can be formed at a level (e.g., a vertical level) 330. Digit lines 318-1 and 318-2 can be selectively coupled to a digit line 350, such as hierarchical digit line, formed at a level 352 that can be vertically above level 330 (e.g., in the z-direction). For example, digit line 350 and digit lines 318-1 and 318-2 can be referred to as a hierarchical digit line structure.

As used herein, the term "level" is used to refer to a generally planar region in the z-direction (e.g., in the vertical direction). Accordingly, elements formed at a particular level can refer to elements having at least a portion formed within a particular planar region in the vertical direction. Different levels can refer to planar regions that do not overlap (in the vertical direction). Accordingly, elements formed at different levels refer to elements that do not overlap in the vertical direction.

A local sense amplifier 320 that can correspond to a local sense amplifier 220 can be coupled to digit lines 318-1 and 318-2. Local sense amplifier 320 can be coupled between digit line 350 and a bus 323 that can correspond to bus 223. For example, bus 323 can be formed at level 330, can be between digit lines 318-1 and 318-2, and can extend in the x-direction.

A group of memory cells 312-1 can be coupled to digit line 318-1 and can correspond to a group 216-1. A group of memory cells 312-2 can be coupled to digit line 318-2 and can correspond to a group 216-2. Each respective memory cell 312 can include a capacitor 327 and a vertical TFT 325 that can be coupled between the capacitor 327 and a respective digit line 318. Each vertical TFT 325 is at a level 360 that is between levels 330 and 352. For example, level 360 can be above level 330 and below level 352.

A respective vertical TFT 325 can be configured to select a respective memory cell 312 by selecting the respective capacitor 327 of the respective memory cell 312. For example, a respective vertical TFT 325 can be configured to selectively couple a respective capacitor 327 to a respective digit line 318. As such, the respective capacitor 327 of a respective memory cell 312 can be selectively coupled to a respective digit line 318 by the respective vertical TFT 325 of the respective memory cell 312. In various instances, a vertical TFT 325 can be referred to as a vertical access TFT.

Each vertical TFT 325 can include a vertical gate that can be a portion of an access line 314 that can correspond to an access line 214. For example, access lines 314 can extend in the x-direction. As described further herein, a vertical TFT can include a vertical gate between vertically arranged source/drains. A vertical TFT can be defined as a TFT having respective source/drains at different levels and a gate at a level between the respective levels of the respective source/drains and through which current can pass in the z-direction between the respective source/drains when the TFT is activated. For example, the gate of a vertical TFT 325 can be at the level 360 between a source/drain coupled to a capacitor 327 and source/drain coupled to a digit line 318. In some examples, a vertical TFT can be referred to as a switch, such as vertical TFT switch.

Each of the capacitors 327 can include a capacitor plate 334 that can be shaped like a container. The capacitor plates 334 of the capacitors 327 that can be selectively coupled to digit line 318-1 can be capacitively coupled to a common plate 335-1, and the capacitor plates 334 of the capacitors 327 that can be selectively coupled to digit line 318-2 can be capacitively coupled to a common plate 335-2. Plates 335 can extend in the x-direction along the length of access lines 314. Different voltage potentials can be applied to plates 335 to store (e.g., program) different data values in capacitors 327. In various examples, a region including plates 335 and digit lines 318 and the region therebetween, including memory cells 312 and local sense amplifier 320, can be referred to as a stack 339.

Digit line 350 can be coupled to a main sense amplifier 355 that can be located adjacent to memory array 305, such as in the periphery of array 305. In some examples, local sense amplifier 320 can sense and amplify a signal, such as voltage and/or current signal, from digit line 318-1 or 318-2, corresponding to a data value stored by a memory cell 312 coupled to digit line 318-1 or 318-2 by an activated TFT 325. Local sense amplifier 320 can then transmit the amplified signal to digit line 350 to be sensed by main sense amplifier 355 for output via I/O circuitry, such as I/O circuitry 108. In some examples, a reference signal (e.g., a reference voltage and/or current) can be supplied to sense amplifier 355 during sensing.

Sense amplifier 320 includes vertical TFTs 357-1 and 357-2 (e.g., that can be referred to as vertical sense amplifier TFTs) at vertical level 360. Vertical TFTs 357-1 and 357-2 are coupled between bus 323 and digit line 350. Vertical TFTs 357-1 and 357-2 are configured to selectively couple bus 323 to digit line 350.

A vertical TFT 357 can include a gate, that can be a portion of a control line 358, at the level 360 between a source/drain coupled to bus 323 and source/drain coupled to digit line 350. Control lines 358 can extend in the x-direction, for example. The gates of TFTs 357-1 and 357-2 can be respectively coupled to digit lines 318-1 and 318-2.

A vertical TFT 362-1 at level 360 can be coupled between a bus 364-1 and digit line 318-1, and a vertical TFT 362-2 at level 360 can be coupled between a bus 364-2 and digit line 318-2. For example, vertical TFT 362-1 can be configured to selectively couple bus 364-1 to digit line 318-1, and vertical TFT 362-2 can be configured to selectively couple bus 364-2 to digit line 318-2. Buses 364 can be at a level 365 and can extend in the x-direction. Level 365 can be above level 360 and below level 352 so as to be between levels 352 and 360. In various examples, buses 364 can be coupled to ground.

Vertical TFTs 362-1 and 362-2 can be referred to as vertical pre-charge TFTs, in that vertical TFTs 362-1 and 362-2 can respectively selectively couple digit lines 318-1 and 318-2 to buses 364-1 and 364-2 to pre-charge digit lines 318-1 and 318-2 (e.g., to ground). In some examples, there can be two or more vertical TFTs 362-1 electrically coupled in parallel between bus 364-1 and digit line 318-1, and two or more vertical TFTs 362-2 electrically coupled in parallel between bus 364-2 and digit line 318-2. A vertical TFT 362 can include a gate, that can be a portion of a control line 367, at the level 360 between a source/drain coupled to a bus 364 and a source/drain coupled to a digit line 318. Control line 367 can extend in the x-direction, for example. In some examples, TFTs 357 can have a lower threshold voltage than vertical TFTs 362.

A vertical TFT 370-1 at level 360 can be coupled between digit line 350 and digit line 318-1, and a vertical TFT 370-2 at level 360 can be coupled between digit line 350 and digit line 318-2. For example, vertical TFT 370-1 can be configured to selectively couple digit line 350 to digit line 318-1, and vertical TFT 370-2 can be configured to selectively couple digit line 350 to digit line 318-2. In some examples, there can be two or more vertical TFTs 370-1 electrically coupled in parallel between digit line 350 and digit line 318-1, and two or more vertical TFTs 370-2 electrically coupled in parallel between digit line 350 and digit line 318-2.

A vertical TFT 370 can include a gate, that can be a portion of a control line 372, at the level 360 between a source/drain coupled to digit line 350 and a source/drain coupled to a digit line 318. The control lines 372 can extend in the x-direction, for example. In some examples, TFTs 357 can have a lower threshold voltage than vertical TFTs 370. Vertical TFTs 370 can be referred to as vertical multiplexing TFTs, for example.

Figure 4A:
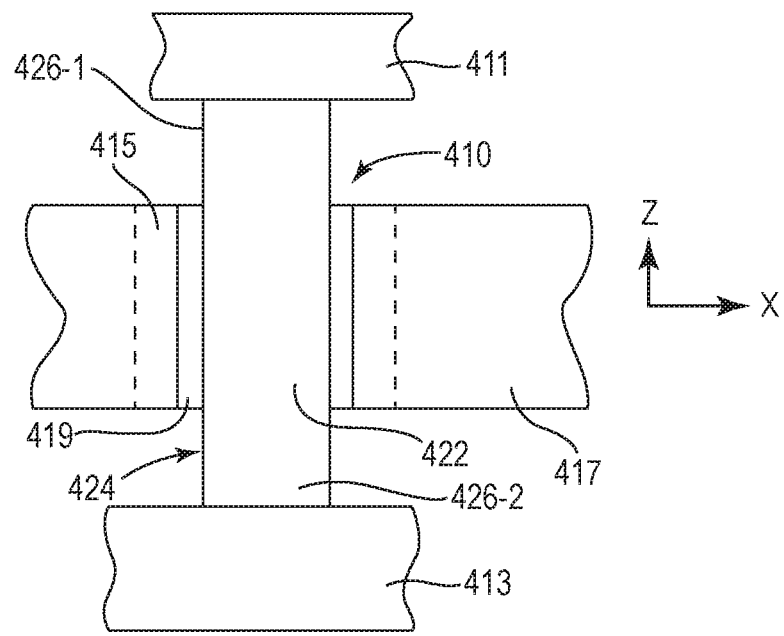
FIG. 4A is a cross-sectional view of a vertical thin film transistor in accordance with a number of embodiments of the present disclosure.
Figure 4B:
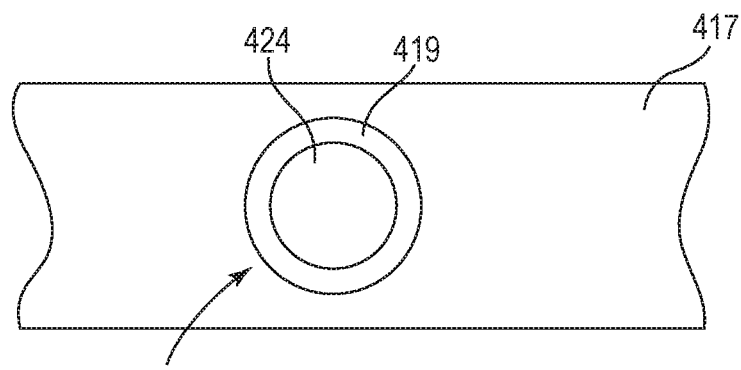
FIG. 4B is a top view of the vertical thin film transistor in FIG. 4A in accordance with a number of embodiments of the present disclosure.

FIG. 4A is a cross-sectional view of a vertical TFT in accordance with a number of embodiments of the present disclosure. FIG. 4B is a top view of the vertical TFT in FIG. 4A in accordance with a number of embodiments of the present disclosure. In FIG. 4A, a vertical TFT 410 is coupled between structures (e.g., elements) 411 and 413. For example, vertical TFT 410 can be configured to selectively electrically couple structure 411 to structure 413. As such, structure 411 and structure 413 are selectively coupled. In various examples, the various vertical TFTs disclosed herein can be vertical TFT 410, and structures 411 and 413 can be the various structures disclosed herein between which a vertical TFT is coupled. TFT 410 can be an n-channel or a p-channel vertical TFT.

TFT 410 can include a gate 415 that can be a portion of a line 417, such as an access line or a control line. Gate 415 can wrap completely around a gate dielectric 419 that can wrap completely around a portion 422 of a vertical semiconductor structure 424 that can be polysilicon (e.g., polycrystalline silicon). A channel can form in portion 422 upon activation of TFT 410. Portion 422 can be between vertically arranged source/drains 426-1 and 426-2 of TFT 410 that are in semiconductor structure 424. Source/drain 426-1 can be coupled to structure 411 and source/drain 426-2 can be coupled to structure 413. For example, source/drains 426-1 and 426-2 can be at different vertical levels and current can flow vertically between source/drains 426-1 and 426-2.

Figure 5:
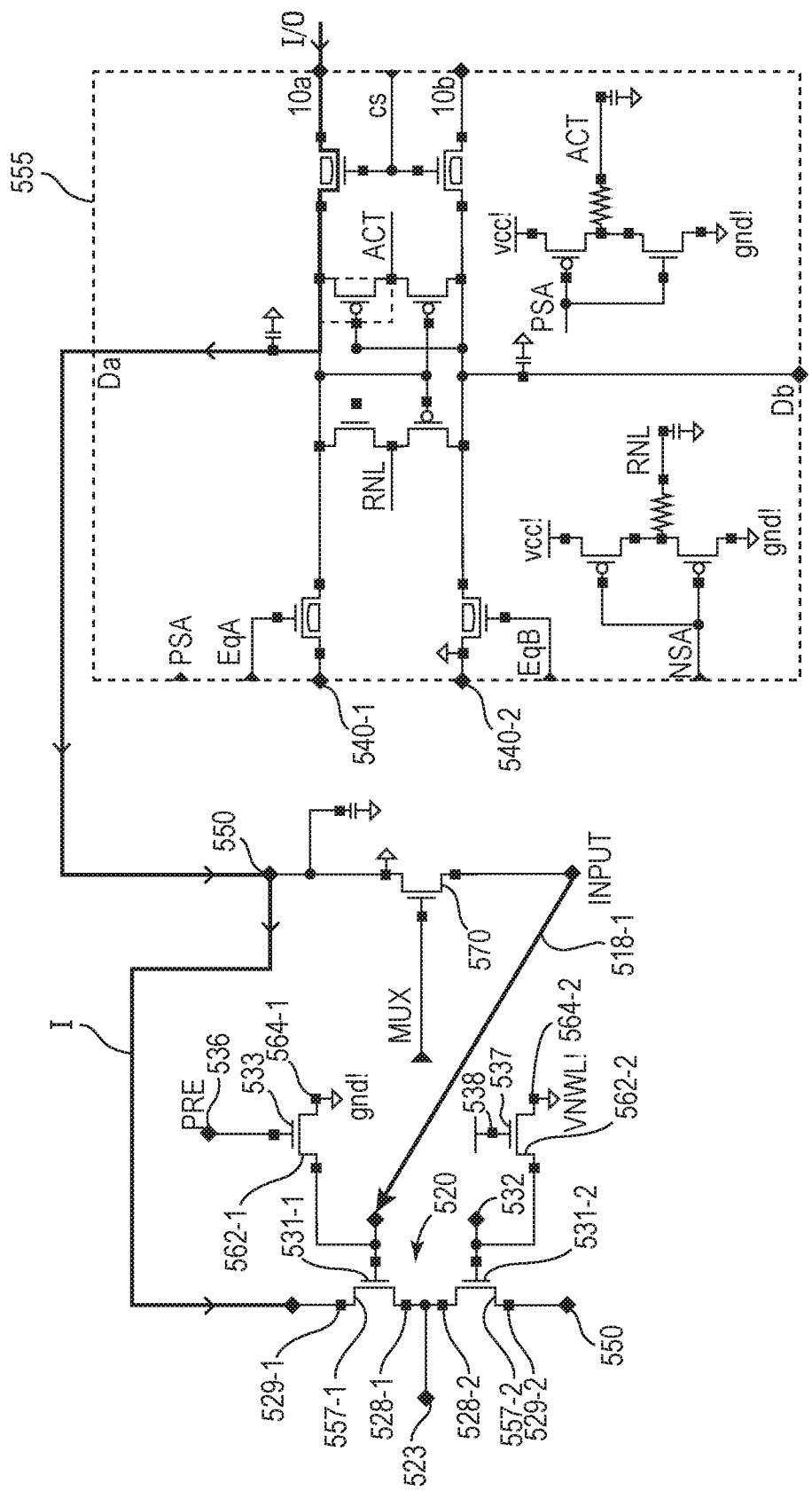
FIG. 5 is a schematic diagram of circuitry associated with a local sense amplifier and a main sense amplifier in accordance with a number of embodiments of the present disclosure.

FIG. 5 is a schematic diagram of circuitry associated with a local sense amplifier, such as a local sense amplifier 520 (e.g., a local common source sense amplifier), and a main sense amplifier, such as a main sense amplifier 555, in accordance with a number of embodiments of the present disclosure. For example, the various local sense amplifiers disclosed herein can be local sense amplifier 520, and the various main sense amplifiers disclosed herein can be main sense amplifier 555. In various examples, main sense amplifier 555 can be formed in the periphery of a memory array, such as the various memory arrays disclosed herein. In some examples, local sense amplifier can operate as a pull-down charge amplifier.

Local sense amplifier 520 can include local common source pre-amplifier devices, such as transistors 557-1 and 557-2 that can respectively correspond to vertical TFTs 357-1 and 357-2 in FIG. 3. In some examples, transistors 557-1 and 557-2 can be n-channel transistors. For example, sense amplifier 520 can be an n-type sense amplifier.

Source/drains 528-1 and 528-2 respectively of transistors 557-1 and 557-2 can be coupled to a node 523 that can correspond to bus 323 in FIG. 3. Note that source/drains 528-1 and 528-2 can be a common source drain 528-1/528-2 to transistors 557-1 and 557-2. Source/drains 529-1 and 529-2 respectively of transistors 557-1 and 557-2 can be coupled to a node 550 that can correspond to digit line 350 in FIG. 3. Gate 531-1 of transistor 557-1 can be coupled to a digit line 518-1 that can be digit line 318-1 in FIG. 3. Gate 531-2 of transistor 557-2 can be coupled to a node 532 that can correspond to digit line 318-2 in FIG. 3.

Transistors 562-1 and 562-2 can respectively correspond to vertical TFTs 362-1 and 362-2 in FIG. 3. A source/drain of transistor 562-1 can be coupled to digit line 518-1 and gate 531-1 of transistor 557-1. A source/drain of transistor 562-2 can be coupled to node 532 and gate 531-2 of transistor 557-2. The other source/drain of transistor 562-1 can be coupled to a node 564-1 that can correspond to bus 364-1 in FIG. 3. The other source/drain of transistor 562-2 can be coupled to a node 564-2 that can correspond to bus 364-2 in FIG. 3. The gate 533 of transistor 562-1 can correspond to the control line 367 in FIG. 3 coupled to vertical TFT 362-1 and can be coupled to an activation node 536. The gate 537 of transistor 562-2 can correspond to the control line 367 in FIG. 3 coupled to vertical TFT 362-2 and can be coupled to an activation node 538. In some examples, nodes 564 can be grounded. However, in the example of FIG. 5, node 564-2 is coupled to a voltage VNWL!, while node 564-1 is coupled to ground (gnd!).

A transistor 570, that can correspond to vertical TFT 370-1 in FIG. 3, can be coupled between node 550 and data line 518-1. Although not shown in FIG. 5, a transistor, that can correspond to vertical TFT 370-2 in FIG. 3, can be coupled between node 550 and node 532.

To sense a memory cell associated with digit line 518-1, the vertical access TFT coupled to the memory cell can be activated to couple the memory cell to digit line 518-1. During sensing, digit line 518-1, and thus the gate 531-1 of transistor 557-1, can be pre-charged to ground in response to activating TFT 562-1. In the case where transistors 557-1 and 557-2 can be n-channel transistors (e.g., sense amplifier 520 can be a n-type sense amplifier) and transistors 562-1 and 562-2 can be n-channel transistors, while gate 531-1 and digit line 518-1 are grounded, a negative voltage potential can be applied to node 523, and thus common/source drain 528-1/528-2, and a positive voltage potential can be applied to node 550 by a node 540-1 of main sense amplifier 550.

For example, the negative voltage potential applied to node 523 can activate (e.g., turn on) sense amplifier 520. As a result, a current "I" can flow from node 550 to node 523 that can be sensed by main sense amplifier 555. In some examples, transistor 570 can be activated after sensing the memory cell to couple main sense amplifier 550 back to the memory cell via digit line 518-1.

In various examples, node 523 can supply power to sense amplifier 520. In some instances, a reference voltage can be supplied to a node 540-2 of main sense amplifier 550 during sensing.

In the case where transistors 557-1 and 557-2 can be p-channel transistors (e.g., sense amplifier 520 can be a p-type sense amplifier) and transistors 562-1 and 562-2 can be p-channel transistors, while gate 531-1 is grounded, a positive voltage potential can be applied to node 523, and thus common/source drain 528-1/528-2, and a negative voltage potential, such as negative VCC, can be applied to node 550. As a result, current can flow from node 523 to node 550 that can be sensed by main sense amplifier 555.

Figure 6:
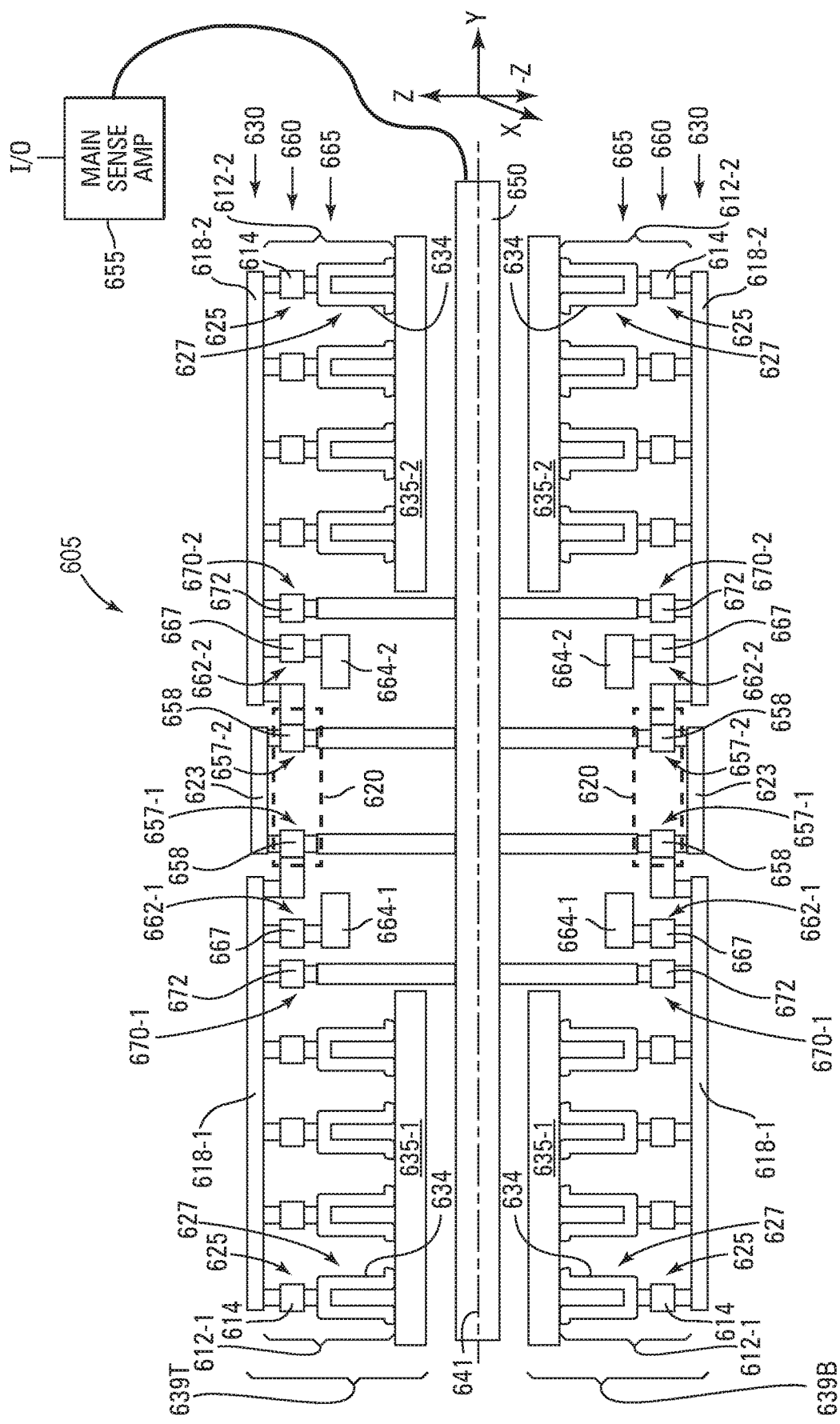
FIG. 6 is a cross-sectional view of a portion of a stacked memory array having symmetric stacks with vertical access transistors in accordance with a number of embodiments of the present disclosure.

FIG. 6 is a cross-sectional view of a portion of a stacked (e.g., three-dimensional) memory array 605 in accordance with a number of embodiments of the present disclosure. For example, memory array 605 can be a portion of memory array 105 and/or memory array 205.

The figures herein follow a numbering convention in which the first digit or digits correspond to the drawing figure number and the remaining digits identify an element or component in the drawing. Similar (e.g., the same) elements or components between different figures may be identified by the use of similar digits. For example, similar digits in FIGS. 3 and 6 can identify similar components. For example, digit 20 in the reference number 320 in FIG. 3 and in the reference number 620 in FIG. 6 can identify similar local sense amplifiers in FIGS. 3 and 6.

In FIG. 6 stacks 639T and 639B extend in opposite directions from a digit line 650 (e.g., a hierarchical digit line), that can be digit line 350 in FIG. 3, such that stacks 639T and 639B are symmetric about digit line 650. For example, stacks 639T and 639B can be symmetric about a center longitudinal axis 641 of digit line 650. As such, axis 641 can be referred to as a symmetry axis. Common numbering is used in stacks 639T and 639B to identify the same components or elements in stacks 639T and 639B.

In FIG. 6, the z-direction is perpendicular to the y-direction and the x-direction that is into and out of the page and perpendicular to the face plane of the page (e.g., y-z plane). In FIG. 6, the z-direction is perpendicular to axis 641, extends in opposite directions from axis 641, and is measured from axis 641. For example, the levels 630 are respectively at the same levels in the respective stacks 639T and 639B relative to axis 641; the levels 660 are respectively at the same levels in the respective stacks 639T and 639B relative to axis 641; and the levels 665 are respectively at the same levels in the respective stacks 639T and 639B relative to axis 641. For example, the levels 630 are respectively at the same distances in opposite z-directions from axis 641;

the levels 660 are respectively at the same distances in opposite z-directions from axis 641; and the levels 665 are respectively at the same distances in opposite z-directions from axis 641.

Digit line 650 can be coupled to a main sense amplifier 655 that can be main sense amplifier 355 and/or main sense amplifier 555. For example, main sense amplifier 655 can be located adjacent to memory array 605, such as in the periphery of array 605. Each of the stacks 639A and 639B can be described as follows, in that stacks 639A and 639B are symmetric:

Digit lines 618-1 and 618-2 can be formed at level 630 and can be selectively coupled to digit line 650. A local sense amplifier 620 can be coupled to digit lines 618-1 and 618-2. Local sense amplifier 620 can be coupled between digit line 650 and a bus 623 that can correspond to bus 223. For example, bus 623 can be formed at level 630, can be between digit lines 618-1 and 618-2, and can extend in the x-direction. For example, digit line 650 and digit lines 618-1 and 618-2 can be referred to as a hierarchical digit line structure.

A group of memory cells 612-1 can be coupled to digit line 618-1 and can correspond to a group 216-1. A group of memory cells 612-2 can be coupled to digit line 618-2 and can correspond to a group 216-2. Each respective memory cell 612 can include a capacitor 627 and a vertical TFT 625 that can be coupled between the capacitor 627 and a respective digit line 618. Each vertical TFT 625 is at level 660 that is between level 630 and digit line 650.

A respective vertical TFT 625 can be configured to select a respective memory cell 612 by selecting the respective capacitor 627 of the respective memory cell 612. For example, a respective vertical TFT 625 can be configured to selectively couple a respective capacitor 627 to a respective digit line 618. As such, the respective capacitor 627 of a respective memory cell 612 can be selectively coupled to a respective digit line 618 by the respective vertical TFT 625 of the respective memory cell 612. In various instances, a vertical TFT 625 can be referred to as a vertical access TFT.

Each vertical TFT 625 can include a vertical gate that can be a portion of an access line 614 that can correspond to an access line 214. For example, access lines 614 can extend in the x-direction. The gate of a vertical TFT 625 can be at the level 660 between a source/drain coupled to a capacitor 627 and source/drain coupled to a digit line 618.

Each of the capacitors 627 can include a capacitor plate 634 that can be shaped like a container. The capacitor plates 634 of the capacitors 627 that can be selectively coupled to digit line 618-1 can be capacitively coupled to a common plate 635-1, and the capacitor plates 634 of the capacitors 627 that can be selectively coupled to digit line 618-2, can be capacitively coupled to a common plate 635-2. Plates 635 can extend in the x-direction along the length of access lines 614. Different voltage potentials can be applied to plates 635 to store different data values in capacitors 627.

Sense amplifier 620 includes vertical TFTs 657-1 and 657-2 (e.g., that can be referred to as vertical sense amplifier TFTs) at level 660. Vertical TFTs 657-1 and 657-2 are coupled between bus 623 and digit line 650. Vertical TFTs 657-1 and 657-2 can be configured to selectively couple bus 623 to digit line 650.

A vertical TFT 657 can include a gate, that can be a portion of a control line 658, at the level 660 between a source/drain coupled to bus 623 and source/drain coupled to digit line 650. Control lines 658 can extend in the x-direction, for example. The gates of TFTs 657-1 and 657-2 can be respectively coupled to digit lines 618-1 and 618-2.

A vertical TFT 662-1 at level 660 can be coupled between a bus 664-1 and digit line 618-1, and a vertical TFT 662-2 at level 660 can be coupled between a bus 664-2 and digit line 618-2. For example, vertical TFT 662-1 can be configured to selectively couple bus 664-1 to digit line 618-1, and vertical TFT 662-2 can be configured to selectively couple bus 664-2 to digit line 618-2. Buses 664 can be at level 665 and can extend in the x-direction. Level 665 can be between digit line 650 and level 660. In various examples, buses 664 can be coupled to ground.

Vertical TFTs 662-1 and 662-2 can be referred to as vertical pre-charge TFTs, in that vertical TFTs 662-1 and 662-2 can respectively selectively couple digit lines 618-1 and 618-2 to buses 664-1 and 664-2 to pre-charge digit lines 618-1 and 618-2 (e.g., to ground). In some examples, there can be two or more vertical TFTs 662-1 electrically coupled in parallel between bus 664-1 and digit line 618-1, and two or more vertical TFTs 662-2 electrically coupled in parallel between bus 664-2 and digit line 618-2. A vertical TFT 662 can include a gate, that can be a portion of a control line 667, at the level 660 between a source/drain coupled to a bus 664 and a source/drain coupled to a digit line 618. Control line 667 can extend in the x-direction, for example. In some examples, TFTs 657 can have a lower threshold voltage than vertical TFTs 662.

A vertical TFT 670-1 at level 660 can be coupled between digit line 650 and digit line 618-1, and a vertical TFT 670-2 at level 660 can be coupled between digit line 650 and digit line 618-2. For example, vertical TFT 670-1 can be configured to selectively couple digit line 650 to digit line 618-1, and vertical TFT 670-2 can be configured to selectively couple digit line 650 to digit line 618-2. In some examples, there can be two or more vertical TFTs 670-1 electrically coupled in parallel between digit line 650 and digit line 618-1, and two or more vertical TFTs 670-2 electrically coupled in parallel between digit line 650 and digit line 618-2.

A vertical TFT 670 can include a gate, that can be a portion of a control line 672, at the level 660 between a source/drain coupled to digit line 650 and a source/drain coupled to a digit line 618. The control lines 672 can extend in the x-direction, for example. In some examples, TFTs 657 can have a lower threshold voltage than vertical TFTs 670. Vertical TFTs 670 can be referred to as vertical multiplexing TFTs, for example.

In some examples, local sense amplifier 620 can sense and amplify a signal, such as voltage and/or current signal, from digit line 618-1 or 618-2, corresponding to a data value stored by a memory cell 612 coupled to digit line 618-1 or 618-2 by an activated TFT 625. Local sense amplifier 620 can then transmit the amplified signal to digit line 650 to be sensed by main sense amplifier 655 for output via I/O circuitry, such as I/O circuitry 108. In some examples, a reference signal (e.g., a reference voltage and/or current) can be supplied to sense amplifier 655 during sensing.

Figure 7:
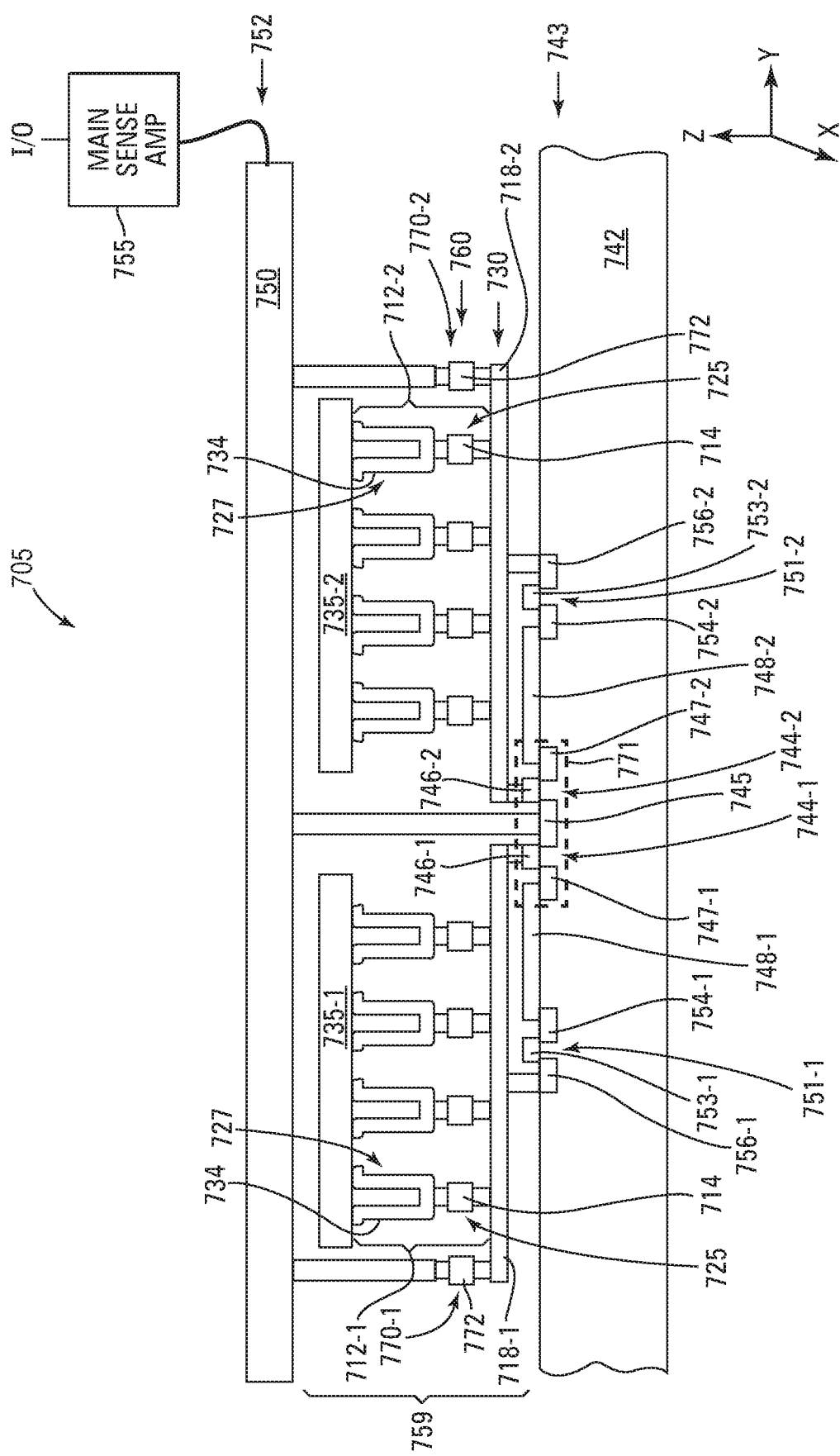
FIG. 7 is a cross-sectional view of a portion of a memory array having vertical access transistors and a local sense amplifier with horizontal planar transistors in accordance with a number of embodiments of the present disclosure.

FIG. 7 is a cross-sectional view of a portion of a memory array, such as a memory array 705, in accordance with a number of embodiments of the present disclosure. For example, memory array 705 can be a portion of memory array 105 and/or memory array 205. In FIG. 7, the z-direction is perpendicular to the y-direction and the x-direction that is into and out of the page and perpendicular to the face plane of the page (e.g., y-z plane). For example, the z-direction can perpendicular to a base structure, such as a semiconductor 742 (e.g., a monocrystalline semiconductor) of array 705. For example, semiconductor 742 can be monocrystalline silicon. Semiconductor 742 can be at a level 743, such as a base level of array 705.

Digit lines 718-1 and 718-2 (e.g., local digit lines) can be formed at a level (e.g., a vertical level) 730 that can be vertically above level 743 (e.g., in the z-direction). Digit lines 718-1 and 718-2 can be selectively coupled to a digit line 750, such as hierarchical digit line, formed at a level 752 that can be vertically above level 730 (e.g., in the z-direction). For example, digit line 750 and digit lines 718-1 and 718-2 can be referred to as a hierarchical digit line structure.

Semiconductor 742 can include a local sense amplifier 771 (e.g., a common source local sense amplifier) that can correspond to a local sense amplifier 220 and that can be coupled to digit lines 718-1 and 718-2. For example, local sense amplifier 771 can be at level 743 and can be formed in and/or on semiconductor 742. In various instances, local sense amplifier 771 can be a CMOS device. In some instances, local sense amplifier 771, that is formed in and/or on semiconductor 742 (e.g., as a CMOS device), can perform better than local sense amplifier 320 that includes TFTs 357.

A group of memory cells 712-1 can be coupled to digit line 718-1 and can correspond to a group 216-1. A group of memory cells 712-2 can be coupled to digit line 718-2 and can correspond to a group 216-2. Each respective memory cell 712 can include a capacitor 727 and a vertical TFT 725 that can be coupled between the capacitor 727 and a respective digit line 718. Each vertical TFT 725 is at a level 760 that is between levels 730 and 752. For example, level 760 can be above level 730 and below level 752. Note that level 730 can be between level 743 and level 760.

In some instances, positioning sense amplifier 771 under array 705 reduces the size of the gap between the group of memory cells 712-1 and the group of memory cells 712-2 compared to the size of the gap between the group of memory cells 312-1 and the group of memory cells 312-2 of array 305 in FIG. 3 that contains sense amplifier 320. Reducing the gap can reduce the array size such that array 705 is smaller than array 305.

A respective vertical TFT 725 can be configured to select a respective memory cell 712 by selecting the respective capacitor 727 of the respective memory cell 712. For example, a respective vertical TFT 725 can be configured to selectively couple a respective capacitor 727 to a respective digit line 718. As such, the respective capacitor 727 of a respective memory cell 712 can be selectively coupled to a respective digit line 718 by the respective vertical TFT 725 of the respective memory cell 712. In various instances, a vertical TFT 725 can be referred to as a vertical access TFT.

Each vertical TFT 725 can include a vertical gate that can be a portion of an access line 714 that can correspond to an access line 214. For example, access lines 714 can extend in the x-direction. The gate of vertical TFT 725 can be at the level 760 between a source/drain coupled to a capacitor 727 and source/drain coupled to a digit line 718.

Each of the capacitors 727 can include a capacitor plate 734 that can be shaped like a container. The capacitor plates 734 of the capacitors 727 that can be selectively coupled to digit line 718-1 can be capacitively coupled to a common plate 735-1, and the capacitor plates 734 of the capacitors 727 that can be selectively coupled to digit line 718-2 can be capacitively coupled to a common plate 735-2. Plates 735 can extend in the x-direction along the length of access lines 714. Different voltage potentials can be applied to plates 735 to store (e.g., program) different data values in capacitors 727. In various examples, a region including plates 735 and digit lines 718 and the region therebetween, including memory cells 712, can be referred to as a stack 759.

Digit line 750 can be coupled to a main sense amplifier 755 that can be located adjacent to memory array 705, such as in the periphery of array 705. In some examples, local sense amplifier 771 can sense and amplify a signal, such as voltage and/or current signal, from digit line 718-1 or 718-2, corresponding to a data value stored by a memory cell 712 coupled to digit line 718-1 or 718-2 by an activated TFT 725. Local sense amplifier 771 can then transmit the amplified signal to digit line 750 to be sensed by main sense amplifier 755 for output via I/O circuitry, such as I/O circuitry 108. In some examples, a reference signal (e.g., a reference voltage and/or current) can be supplied to sense amplifier 755 during sensing.

Local sense amplifier 771 can include horizontal planar transistors 744-1 and 744-2 at level 743 and formed in and/or on semiconductor 742. Transistor 744-1 can be coupled between digit line 750 and a bus 748-1, and transistor 744-2 can be coupled between digit line 750 and a bus 748-2. For example, transistors 744-1 and 744-2 can be configured to respectively selectively couple buses 748-1 and 748-2 to digit line 750.

Transistors 744-1 and 744-2 can have a common source/drain 745 formed in semiconductor 742 that can be coupled to digit line 750. Transistor 744-1 can have a gate 746-1 coupled to digit line 718-1 and a source/drain 747-1 formed in semiconductor 742 and coupled to bus 748-1 so that bus 748-1 is selectively coupled to digit line 750 by transistor 744-1. Transistor 744-2 can have a gate 746-2 coupled to digit line 718-2 and a source/drain 747-2 formed in semiconductor 742 and coupled to bus 748-2 so that bus 748-2 is selectively coupled to digit line 750 by transistor 744-2.

In various examples, source/drains 747-1, 745, and 747-2 can be arranged horizontally. Gates 746, source/drain 745, source/drains 747, and buses 748 can extend in the x-direction. In some instances, buses 748 can be coupled to ground, positive voltages, or negative voltages. For example, buses 748 can be configured to function as bus 323 and/or buses 364 in FIG. 3.

Semiconductor 742 can include horizontal planar transistors 751-1 and 751-2. Transistor 751-1 can be coupled between bus 748-1 and digit line 718-1, and transistor 751-2 can be coupled between bus 748-2 and digit line 718-2. For example, transistors 751-1 and 751-2 can be at level 743 and can be formed in and/or on semiconductor 742. Digit lines 718-1 and 718-2 can be respectively selectively coupled to buses 748-1 and 748-2 by transistors 751-1 and 751-2. For example, transistors 751-1 and 751-2 can be configured to respectively selectively couple buses 748-1 and 748-2 to digit lines 718-1 and 718-2.

Transistor 751-1 can have a gate 753-1 between a source/drain 754-1 and a source/drain 756-1. Source/drain 754-1 can be formed in semiconductor 742 and coupled to bus 748-1, and source/drain 756-1 can be formed in semiconductor 742 and coupled to digit line 718-1. For example, source/drains 754-1 and 756-1 can be arranged horizontally. Transistor 751-2 can have a gate 753-2 between a source/drain 754-2 and a source/drain 756-2. Source/drain 754-2 can be formed in semiconductor 742 and coupled to bus 748-2, and source/drain 756-2 can be formed in semiconductor 742 and coupled to digit line 718-2. For example, source/drains 754-2 and 756-2 can be arranged horizontally. Gates 753, source/drains 754, and source/drains 756 can extend in the x-direction.

A vertical TFT 770-1 at level 760 can be coupled between digit line 750 and digit line 718-1, and a vertical TFT 770-2 at level 760 can be coupled between digit line 750 and digit line 718-2. For example, vertical TFT 770-1 can be configured to selectively couple digit line 750 to digit line 718-1, and vertical TFT 770-2 can be configured to selectively couple digit line 750 to digit line 718-2. A vertical TFT 770 can include a gate, that can be a portion of a control line 772, at the level 760 between a source/drain coupled to digit line 750 and a source/drain coupled to a digit line 718. The control lines 772 can extend in the x-direction, for example. Vertical TFTs 770 can be referred to as vertical multiplexing TFTs, for example.

Figure 8:
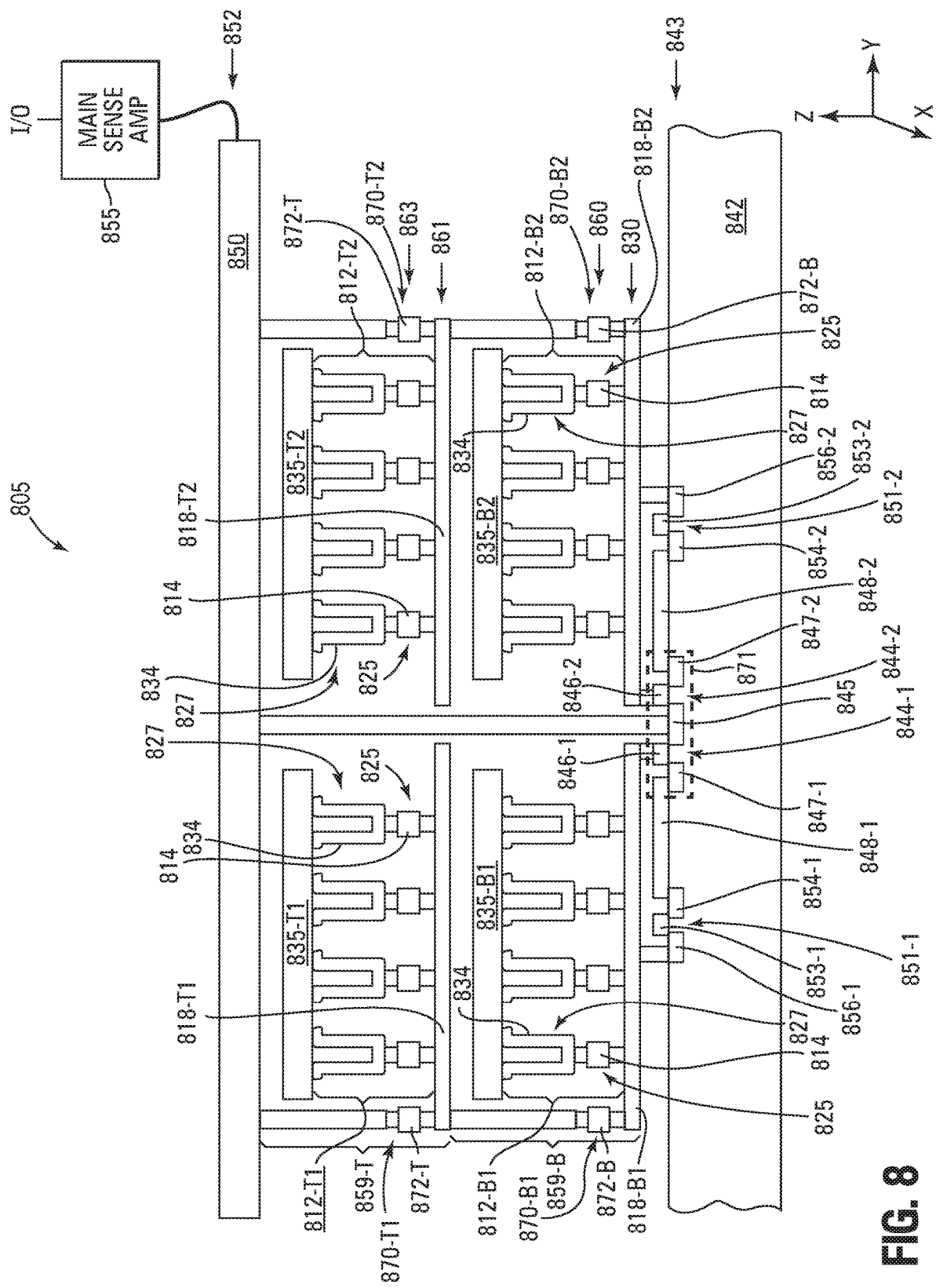
FIG. 8 is a cross-sectional view of a portion of a stacked memory array having vertical access transistors and a local sense amplifier with horizontal planar transistors in accordance with a number of embodiments of the present disclosure.

FIG. 8 is a cross-sectional view of a portion of a stacked (e.g., three-dimensional) memory array 805 in accordance with a number of embodiments of the present disclosure. For example, memory array 805 can be a portion of memory array 105 and/or memory array 205. In FIG. 8, the z-direction is perpendicular to the y-direction and the x-direction that is into and out of the page and perpendicular to the face plane of the page (e.g., y-z plane). For example, the z-direction can perpendicular to a base structure, such as a semiconductor 842 (e.g., a monocrystalline semiconductor), of array 805. For example, semiconductor 842 can be monocrystalline silicon. Semiconductor 842 can be at a level 843, such as a base level of array 805.

Array 805 can include a hierarchical digit line structure that can include digit lines 818-B1 and 818-B2 at a level 830, digit lines 818-T1 and 818-T2 at a level 861, and a digit line 850 (e.g., a hierarchical digit line) at a level 852 and coupled to a main sense amplifier 855 that can be located adjacent to memory array 805, such as in the periphery of array 805. Level 861 can be between level 830 and level 852. Level 861 can be at a greater distance in the z-direction from level 843 than level 830, and level 852 can be at a greater distance in the z-direction from level 843 than level 861. For example, level 861 can be above level 830, and level 852 can be above level 861.

Digit lines 818-B1 and 818-B2 can be included in a stack 859-B that can be stack 759, and digit lines 818-T1 and 818-T2 can be included in a stack 859-T that can be stack 759. Stack 859-T can be between stack 859-B and digit line 850, and stack 859-B can be between semiconductor 842 and stack 859-T. For example, stack 859-B can be above semiconductor 842, and stack 859-T can be above stack 859-B.

Stack 859-B can include a group of memory cells 812-B1 that can be coupled to digit line 818-B1, and a group of memory cells 812-B2 that can be coupled to digit line 818-B2. Stack 859-T can include a group of memory cells 812-T1 that can be coupled to digit line 818-T1, and a group of memory cells 812-T2 that can be coupled to digit line 818-T2. Each respective memory cell 812 can include a capacitor 827 and a vertical TFT 825 that can be coupled between the capacitor 827 and a respective digit line 818.

Each vertical TFT 825 in stack 859-B is at a level 860 that is between levels 830 and 861. For example, level 860 can be above level 830 and below level 861. Note that level 830 is between levels 843 and 860. Each vertical TFT 825 in stack 859-T is at a level 863 that is between levels 861 and 852. For example, level 863 can be above level 861 and below level 852.

A respective vertical TFT 825 can be configured to select a respective memory cell 812 by selecting the respective capacitor 827 of the respective memory cell 812. For example, a respective vertical TFT 825 can be configured to selectively couple a respective capacitor 827 to a respective digit line 818. As such, the respective capacitor 827 of a respective memory cell 812 can be selectively coupled to a respective digit line 818 by the respective vertical TFT 825 of the respective memory cell 812. In various instances, a vertical TFT 825 can be referred to as a vertical access TFT.

Each vertical TFT 825 can include a vertical gate that can be a portion of an access line 814 that can correspond to an access line 214. For example, access lines 814 can extend in the x-direction. The vertical gate of a vertical TFT 825 of a memory cell 812-B (e.g., in stack 859-B) can be at the level 860 between a source/drain coupled to the capacitor 827 of the memory cell 812-B and source/drain coupled to a digit line 818-B. The vertical gate of a vertical TFT 825 of a memory cell 812-T (e.g., in stack 859-T) can be at the level 863 between a source/drain coupled to the capacitor 827 of the memory cell 812-T and source/drain coupled to a digit line 818-T.

Each of the capacitors 827 can include a capacitor plate 834 that can be shaped like a container. The capacitor plates 834 of the capacitors 827 that can be selectively coupled to digit line 818-B1 can be capacitively coupled to a common plate 835-B1, and the capacitor plates 834 of the capacitors 827 that can be selectively coupled to digit line 818-B2 can be capacitively coupled to a common plate 835-B2. The capacitor plates 834 of the capacitors 827 that can be selectively coupled to digit line 818-T1 can be capacitively coupled to a common plate 835-T1, and the capacitor plates 834 of the capacitors 827 that can be selectively coupled to digit line 818-T2 can be capacitively coupled to a common plate 835-T2. Plates 835 can extend in the x-direction along the length of access lines 814. Different voltage potentials can be applied to plates 835 to store different data values in capacitors 827.

Stack 859-B can include a vertical TFT 870-B1 coupled between digit lines 818-B1 and 818-T1 and a vertical TFT 870-B2 coupled between digit lines 818-B2 and 818-T2. Stack 859-T can include a vertical TFT 870-T1 coupled between digit lines 818-T1 and 850 and a vertical TFT 870-T2 coupled between digit lines 818-T2 and 850. Vertical TFTs 870-B1 and 870-B2 can be at level 860, and vertical TFTs 870-T1 and 870-T2 can be at level 863.

Vertical TFT 870-B1 can be configured to selectively couple digit line 818-B1 to digit line 818-T1, and vertical TFT 870-B2 can be configured to selectively couple digit line 818-B2 to digit line 818-T2. A vertical TFT 870-B can include a gate, that can be a portion of a control line 872-B, at the level 860 between a source/drain coupled to a digit line 818-T and a source/drain coupled to a digit line 818-B. The control lines 872-B can extend in the x-direction, for example.

Vertical TFT 870-T1 can be configured to selectively couple digit line 818-T1 to digit line 850, and vertical TFT 870-T2 can be configured to selectively couple digit line 818-T2 to digit line 850. Note that activating vertical TFTs 870-B1 and 870-T1 concurrently can couple digit line 818-B1 to digit line 850 and activating vertical TFTs 870-B2 and 870-T2 concurrently can couple digit line 818-B2 to digit line 850.

A vertical TFT 870-T can include a gate, that can be a portion of a control line 872-T, at the level 863 between a source/drain coupled to a digit line 850 and a source/drain coupled to a digit line 818-T. The control lines 872-T can extend in the x-direction, for example. Vertical TFTs 870 can be referred to as vertical multiplexing TFTs, for example.

Semiconductor 842 can include a local sense amplifier 871 (e.g., a common source local sense amplifier) that can be local sense amplifier 771 and that can be coupled to digit lines 818-B1 and 818-B2. For example, local sense amplifier 871 can be at level 843 and can be formed in and/or on semiconductor 842. In various instances, local sense amplifier 871 can be a CMOS device.

In some examples, local sense amplifier 871 can sense a signal, such as voltage and/or current signal, on digit line 818-B1 corresponding to a data value from a memory cell 812-B1 that can be selected by activating the corresponding TFT 825 or on digit line 818-B2 corresponding to a data value from a memory cell 812-B2 that can be selected by activating the corresponding TFT 825.

In various other examples, local sense amplifier 871 can sense a signal from digit line 818-T1 on digit line 818-B1 corresponding to a data value from a memory cell 812-T1 that can be selected by activating the corresponding TFT 825 or from digit line 818-T2 on digit line 818-B2 corresponding to a data value from a memory cell 812-T2 that can be selected by activating the corresponding TFT 825. For example, TFT 870-B1 can be activated to couple digit line 818-T1 to digit line 818-B1, or TFT 870-B2 can be activated to couple digit line 818-T2 to digit line 818-B2.

In some examples, local sense amplifier 871 can amplify the signal sensed on digit line 818-B1 or 818-B2. Local sense amplifier 871 can then transmit the amplified signal to digit line 850 to be sensed by main sense amplifier 855 for output via I/O circuitry, such as I/O circuitry 108. In some examples, a reference signal (e.g., a reference voltage and/or current) can be supplied to sense amplifier 855 during sensing.

Local sense amplifier 871 can include horizontal planar transistors 844-1 and 844-2 at level 843. For example, horizontal planar transistors 844-1 and 844-2 can be formed in and/or on semiconductor 842. Transistor 844-1 can be coupled between digit line 850 and a bus 848-1, and transistor 844-2 can be coupled between digit line 850 and a bus 848-2. For example, transistors 844-1 and 844-2 can be configured to respectively selectively couple buses 848-1 and 848-2 to digit line 850.

Transistors 844-1 and 844-2 can have a common source/drain 845 formed in semiconductor 842 that can be coupled to digit line 850. Transistor 844-1 can have a gate 846-1 coupled to digit line 818-B1 and a source/drain 847-1 formed in semiconductor 842 and coupled to bus 848-1 so that bus 848-1 is selectively coupled to digit line 850 by transistor 844-1. Transistor 844-2 can have a gate 846-2 coupled to digit line 818-B2 and a source/drain 847-2 formed in semiconductor 842 and coupled to bus 848-2 so that bus 848-2 is selectively coupled to digit line 850 by transistor 844-2.

In various examples, source/drains 847-1, 845, and 847-2 can be arranged horizontally. Gates 846, source/drain 845, source/drains 847, and buses 848 can extend in the x-direction. In some instances, buses 848 can be coupled to ground, positive voltages, or negative voltages. For example, buses 848 can be configured to function as bus 323 and/or buses 364 in FIG. 3.

Semiconductor 842 can include horizontal planar transistors 851-1 and 851-2. Transistor 851-1 can be coupled between bus 848-1 and digit line 818-B1, and transistor 851-2 can be coupled between bus 848-2 and digit line 818-B2. For example, transistors 851-1 and 851-2 can be at level 843 and can be formed in and/or on semiconductor 842. Digit lines 818-B1 and 818-B2 can be respectively selectively coupled to buses 848-1 and 848-2 by transistors 851-1 and 851-2. For example, transistors 851-1 and 851-2 can be configured to respectively selectively couple buses 848-1 and 848-2 to digit lines 818-B1 and 818-B2.

Transistor 851-1 can have a gate 853-1 between a source/drain 854-1 and a source/drain 856-1. Source/drain 854-1 can be formed in semiconductor 842 and coupled to bus 848-1, and source/drain 856-1 can be formed in semiconductor 842 and coupled to digit line 818-B1. For example, source/drains 854-1 and 856-1 can be arranged horizontally.

Transistor 851-2 can have a gate 853-2 between a source/drain 854-2 and a source/drain 856-2. Source/drain 854-2 can be formed in semiconductor 842 and coupled to bus 848-2, and source/drain 856-2 can be formed in semiconductor 842 and coupled to digit line 818-B2. For example, source/drains 854-2 and 856-2 can be arranged horizontally. Gates 853, source/drains 854 and source/drains 856 can extend in the x-direction in various examples.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a" or "an" can refer to one or more of something, and "a number of" something can refer to one or more of such things. For example, a number of memory cells can refer to one or more memory cells. A "plurality" of something intends two or more. As used herein, the term "coupled" can include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). As used herein, multiple acts being performed concurrently refers to acts overlapping, at least in part, over a particular time period. It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction.

As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An apparatus, comprising:
a first memory cell comprising a first storage device selectively coupled to a first digit line at a first level by a first vertical transistor at a second level;
a second memory cell comprising a second storage device selectively coupled to a second digit line at the first level by a second vertical transistor at the second level;
a third digit line at a third level, wherein the second level is between the first and third levels;
a local sense amplifier coupled to the first digit line, the second digit line, and the third digit line; and
a main sense amplifier coupled to the third digit line.

2. The apparatus of claim 1, further comprising:
a third vertical transistor at the second level and coupled between the first digit line and the third digit line;
a fourth vertical transistor at the second level and coupled between the second digit line and the third digit line.

3. The apparatus of claim 1, further comprising a bus at the first level, wherein the local sense amplifier comprises:
a third vertical transistor at the second level and coupled between the bus and the third digit line, a gate of the third vertical transistor coupled to the first digit line; and
a fourth vertical transistor at the second level and coupled between the bus and the third digit line, a gate of the fourth vertical transistor coupled to the second digit line.

4. The apparatus of claim 3, wherein the bus is a first bus, the apparatus further comprising:
second and third buses at a level between the second and third levels;
a fifth vertical transistor at the second level and coupled between the first digit line and the second bus; and
a sixth vertical transistor at the second level and coupled between the second digit line and the third bus.

5. The apparatus of claim 4, wherein the second and third buses are coupled to ground.

6. The apparatus of claim 1, wherein the first and second vertical transistors are n-channel transistors or p-channel transistors.

7. The apparatus of claim 1, wherein the first and second vertical transistors are vertical thin film transistors.

8. The apparatus of claim 1, wherein the first and second memory cells are dynamic random access memory cells.

9. The apparatus of claim 1, wherein the first storage device is a capacitor and the second storage device is a capacitor.

10. The apparatus of claim 1, wherein the local sense amplifier comprises:
a first horizontal planar transistor at a base level and configured to selectively couple a first bus to the third digit line;
a second horizontal planar transistor at the base level and configured to selectively couple a second bus to the third digit line;
wherein the first level is between the base level and the second level.

11. The apparatus of claim 10, wherein
a gate of the first horizontal planar transistor is coupled to the first digit line; and
a gate of the second horizontal planar transistor is coupled to the second digit line.

12. The apparatus of claim 10, wherein
the first bus is coupled to a first source/drain of the first horizontal planar transistor;
the second bus is coupled to a first source/drain of the second horizontal planar transistor; and
the third digit line is coupled to a second source/drain that is common to the first horizontal planar transistor and the second horizontal planar transistor.

13. The apparatus of claim 10, further comprising:
a third horizontal planar transistor at the base level and configured to selectively couple the first digit line to the first bus; and
a fourth horizontal planar transistor at the base level and configured to selectively couple the second digit line to the second bus.

14. The apparatus of claim 1, wherein the storage devices are between the second and third levels.

15. An apparatus comprising:
a hierarchical digit line structure comprising a first digit line at a first level and a second digit line at a second level and coupled to a main sense amplifier;
a memory cell comprising a first vertical transistor and a storage element, the first vertical transistor at a third level between the first and second levels and coupled between the first digit line and the storage element;
a second vertical transistor at the third level and coupled between the first and second digit lines; and
a horizontal transistor at a fourth level and coupled between a bus at the fourth level and the second digit line, a gate of the horizontal transistor coupled to the first digit line;
wherein the first level is between the third level and the fourth level.

16. The apparatus of claim 15, wherein
the hierarchical digit line structure further comprises a third digit line at the first level; and
the apparatus further comprises:
an additional memory cell comprising a third vertical transistor at the third level and an additional storage element, the third vertical transistor coupled between the third digit line and the additional storage element; and
a fourth vertical transistor at the third level coupled between the second and third digit lines.

17. The apparatus of claim 16, further comprising an additional horizontal transistor at the fourth level and coupled between an additional bus at the fourth level and the second digit line, a gate of the additional horizontal transistor coupled to the third digit line.

18. The apparatus of claim 15, further comprising an additional horizontal transistor at the fourth level and coupled between the bus and the first digit line.

19. An apparatus, comprising:
respective stacks extending in opposite directions from a first digit line, wherein the first digit line is coupled to a main sense amplifier;
wherein each of the respective stacks comprises:
a second digit line and a third digit line at a first level in the respective stack;
a group of first memory cells, each of the respective first memory cells comprising a respective first storage device selectively coupled to the second digit line by a respective first vertical thin film transistor at a second level in the respective stack, wherein the second level is between the first digit line and the first level;
a group of second memory cells, each of the respective second memory cells comprising a respective second storage device selectively coupled to the third digit line by a respective second vertical thin film transistor at the second level;
a third vertical thin film transistor at the second level and coupled between the first digit line and the second digit line; and
a fourth vertical thin film transistor at the second level and coupled between the first digit line and the third digit line.

20. The apparatus of claim 19, wherein each of the respective stacks further comprises:
a bus at the first level between the second digit line and the third digit line; and
a local sense amplifier, comprising:
a fifth vertical thin film transistor at the second level configured to selectively couple the bus to the first digit line, and
a sixth vertical thin film transistor at the second level configured to selectively couple the bus to the first digit line.

21. The apparatus of claim 20, wherein
the second digit line is coupled to a gate of the fifth vertical thin film transistor; and
the third digit line is coupled to a gate of the sixth vertical thin film transistor.

22. The apparatus of claim 19, wherein each of the respective stacks further comprises:
first and second buses between first digit line and the second level;
a fifth vertical transistor at the second level and coupled between the second digit line and the first bus; and
a sixth vertical transistor at the second level and coupled between the third digit line and the second bus.

23. The apparatus of claim 19, wherein first digit line is a hierarchical digit line.

24. An apparatus comprising:
a hierarchical digit line structure comprising a first digit line at a first level, a second digit line at a second level, and a third digit line at a third level, the second level between the first and third levels;
a first memory cell comprising a first vertical thin film transistor and a first storage element, the first vertical thin film transistor at a fourth level between the first and second levels and coupled between the first digit line and the first storage element;
a second vertical thin film transistor at the fourth level and coupled between the first and second digit lines;
a second memory cell comprising a third vertical thin film transistor and a second storage element, the third vertical thin film transistor at a fifth level between the second and third levels and coupled between the second digit line and the second storage element;
a fourth vertical thin film transistor at the fifth level and coupled between the second and third digit lines; and
a semiconductor at a sixth level, comprising a local sense amplifier coupled to the first and third digit lines;
wherein
the third digit line is coupled to a main sense amplifier; and
the first level is between the fourth level and the sixth level.

25. The apparatus of claim 24,
wherein the hierarchical digit line structure further comprises a fourth digit line at the first level and a fifth digit line at the second level; and
wherein the apparatus further comprises:
a third memory cell comprising and a fifth vertical thin film transistor at the fourth level and a third storage element, the fifth vertical thin film transistor coupled between the fourth digit line and the third storage element;
a sixth vertical thin film transistor at the fourth level coupled between the fourth and fifth digit lines;
a fourth memory cell comprising and a seventh vertical thin film transistor at the fifth level and a fourth storage element, the seventh vertical thin film transistor coupled between the fifth digit line and the fourth storage element; and
an eighth vertical thin film transistor at the fifth level coupled between the third and fifth digit lines.

26. The apparatus of claim 25, wherein the local sense amplifier is coupled to the fourth digit line.

* * * * *